United States Patent
Chitnis

(10) Patent No.: US 8,021,904 B2
(45) Date of Patent: Sep. 20, 2011

(54) OHMIC CONTACTS TO NITROGEN POLARITY GAN

(75) Inventor: Ashay Chitnis, Goleta, CA (US)

(73) Assignee: Cree, Inc., Durham, NC (US)

( * ) Notice: Subject to any disclaimer, the term of this patent is extended or adjusted under 35 U.S.C. 154(b) by 488 days.

(21) Appl. No.: 12/012,376

(22) Filed: Jan. 31, 2008

(65) Prior Publication Data

US 2008/0185608 A1 Aug. 7, 2008

Related U.S. Application Data

(60) Provisional application No. 60/899,247, filed on Feb. 1, 2007.

(51) Int. Cl.
*H01L 21/00* (2006.01)
*H01L 27/15* (2006.01)
*H01L 29/165* (2006.01)
*H01L 31/12* (2006.01)
*H01L 31/153* (2006.01)
*H01L 33/00* (2010.01)

(52) U.S. Cl. .......... 438/46; 438/105; 257/E21.476; 257/85

(58) Field of Classification Search .......... 438/105, 438/46, 607, 478; 257/85, E21.476, E21.16
See application file for complete search history.

(56) References Cited

U.S. PATENT DOCUMENTS

| | | | |
|---|---|---|---|
| 4,946,547 A | 8/1990 | Palmour et al. | 156/643 |
| 5,192,987 A | 3/1993 | Khan et al. | 257/183.1 |
| 5,200,022 A | 4/1993 | Kong et al. | 156/612 |
| RE34,861 E | 2/1995 | Davis et al. | 437/100 |
| 5,393,990 A | 2/1995 | Kohn | |
| 5,959,316 A | 9/1999 | Lowrey | 257/98 |
| 6,004,881 A | 12/1999 | Bozada et al. | |
| 6,046,464 A | 4/2000 | Schetzina | 257/96 |
| 6,071,780 A | 6/2000 | Okamoto | 438/287 |
| 6,177,685 B1 | 1/2001 | Teraguchi et al. | |
| 6,316,820 B1 | 11/2001 | Schmitz et al. | 257/649 |
| 6,375,340 B1 | 4/2002 | Biebl et al. | |

(Continued)

FOREIGN PATENT DOCUMENTS

EP 1577951 A2 3/2005

(Continued)

OTHER PUBLICATIONS

Ho Won Jang et al. "Characterization of Band Bendings on Ga-Face and N-Face GaN Films Grown by Metalorganic Chemical-Vapor Deposition", Journal of Applied Physics Letters, vol. 80, No. 21, May 27, 2002, pp. 3955-3957.

O. Ambacher et al."Two-Dimensional Electron Gases Induced by Spontaneous and Piezoelectric Polarization Charges in N- and Ga-Face AlGaN/GaN Heterostructures", Journal of Applied Physics, vol. 85, No. 6, Mar. 15, 1999, pp. 3222-3233.

(Continued)

*Primary Examiner* — Walter L Lindsay, Jr.
(74) *Attorney, Agent, or Firm* — Koppel, Patrick, Heybl & Philpott

(57) ABSTRACT

Contacting materials and methods for forming ohmic contact to the N-face polarity surfaces of Group-III nitride based semiconductor materials, and devices fabricated using the methods. One embodiment of a light emitting diode (LED) a Group-III nitride active epitaxial region between two Group-III nitride oppositely doped epitaxial layers. The oppositely doped layers have alternating face polarities from the Group III and nitrogen (N) materials, and at least one of the oppositely doped layers has an exposed surface with an N-face polarity. A first contact layer is included on and forms an ohmic contact with the exposed N-face polarity surface. In one embodiment, the first contact layer comprises indium nitride.

28 Claims, 2 Drawing Sheets

U.S. PATENT DOCUMENTS

| | | |
|---|---|---|
| 6,480,389 B1 | 11/2002 | Shie et al. |
| 6,486,499 B1 | 11/2002 | Krames et al. ............... 257/81 |
| 6,489,637 B1 | 12/2002 | Sakamoto et al. |
| 6,642,652 B2 | 11/2003 | Collins et al. ............... 313/512 |
| 6,657,236 B1 | 12/2003 | Thibeault et al. ............ 257/98 |
| 6,791,259 B1 | 9/2004 | Stokes |
| 6,828,596 B2 | 12/2004 | Steigerwald et al. ......... 257/99 |
| 6,869,812 B1 | 3/2005 | Liu |
| 6,870,311 B2 | 3/2005 | Mueller et al. |
| 6,946,309 B2 | 9/2005 | Camras et al. ............... 438/26 |
| 6,972,438 B2 | 12/2005 | Li et al. |
| 7,005,679 B2 | 2/2006 | Tarsa et al. |
| 7,154,125 B2 | 12/2006 | Koide et al. ................. 257/95 |
| 7,348,212 B2 | 3/2008 | Schiaffino et al. ............ 438/106 |
| 7,365,374 B2 | 4/2008 | Piner et al. .................. 257/189 |
| 7,432,142 B2 | 10/2008 | Saxler et al. ................. 438/167 |
| 7,709,282 B2 | 5/2010 | Fukshima et al. ............ 438/26 |
| 7,714,342 B2 | 5/2010 | Lee et al. .................... 257/98 |
| 2002/0180351 A1 | 12/2002 | McNulty |
| 2003/0085409 A1 | 5/2003 | Shen et al. |
| 2003/0124752 A1 | 7/2003 | Wei et al. |
| 2004/0159865 A1 | 8/2004 | Allen et al. |
| 2005/0077531 A1 | 4/2005 | Kim |
| 2005/0104080 A1 | 5/2005 | Ichihara |
| 2005/0173728 A1 | 8/2005 | Saxler |
| 2005/0224821 A1 | 10/2005 | Sakano |
| 2006/0063289 A1 | 3/2006 | Negley |
| 2006/0081869 A1 | 4/2006 | Lu et al. ..................... 257/99 |
| 2006/0202272 A1 | 9/2006 | Wu et al. ..................... 257/355 |
| 2006/0273335 A1 | 12/2006 | Ashara |
| 2007/0057271 A1 | 3/2007 | Schiaffino et al. |
| 2007/0063215 A1* | 3/2007 | Kohda ......................... 438/46 |
| 2007/0111473 A1* | 5/2007 | Furukawa et al. ............ 438/455 |
| 2007/0200127 A1 | 8/2007 | Andrews et al. |
| 2007/0228415 A1 | 10/2007 | Kanamura et al. |
| 2007/0262338 A1 | 11/2007 | Higashi et al. .............. 257/99 |
| 2008/0217635 A1 | 9/2008 | Emerson |
| 2008/0230799 A1* | 9/2008 | Wang et al. ................. 257/99 |
| 2008/0237640 A1* | 10/2008 | Mishra et al. ............... 257/194 |

FOREIGN PATENT DOCUMENTS

| | | |
|---|---|---|
| EP | 1901341 | 3/2008 |
| EP | 1901342 | 3/2008 |
| JP | 07283140 | 10/1995 |
| JP | 10223901 | 8/1998 |
| JP | 11261052 | 9/1999 |
| JP | 2000174260 | 6/2000 |
| JP | 2001007325 | 1/2001 |
| JP | 2001077415 | 3/2001 |
| JP | 2001098369 | 4/2001 |
| JP | 2002077353 | 3/2002 |
| KR | 200277135 | 10/2002 |
| WO | WO8300408 A1 | 2/1983 |
| WO | WO0004587 | 1/2000 |
| WO | WO2005048361 A2 | 5/2005 |
| WO | WO2005114723 A2 | 12/2005 |
| WO | WO2006035664 A | 4/2006 |
| WO | WO2007141763 A1 | 12/2007 |
| WO | WO2009039805 A1 | 4/2009 |

OTHER PUBLICATIONS

S. Ruvimov et al. "Microstructure of Ti/Al and Ti/Al/Ni/Au OHMIC Contacts for N-GAN", Applied Physics Letters 69(11), Sep. 9, 1996, pp. 1556-1558.

B. P. Luther et al. Analysis of a Thin AlN Interfacial Layer in Ti/Al and Pd/Al ohmic Contacts to N-Type GaN, Appl. Physics Letters 71(26), Dec. 29, 1997, pp. 3859-3861.

Joon Seop Kwak et al. "Crystal-Polarity Dependence of Ti/Al Contacts to Freestanding N-GaN Substrate", Applied Physics Letters, vol. 79, No. 20, Nov. 12, 2001, pp. 3254-3256.

B.P. Luther et al.,"Study of Contact Resistivity, Mechanical Integrity, and Thermal Stability of TI/AL and TA/AL OHMIC Contacts to n-Type GAN", Journal of Electronic Materials, vol. 27, No. 4 1998, pp. 196-199.

Zhou, H.P. et al. Temperature Dependence of Refractive Index In InN Thin Films Grown by Reactive Sputtering, Journal of Applied Physics, vol. 96, No. 6, Sep. 15, 2004, pp. 3199-3205.

Windisch et al. "Impact of Texture-Enhanced Transmission on High-Efficiency Surface-Textured Light-Emitting Diodes", Applied Physics Letters, vol. 79, No. 15, Oct. 2001, pp. 2315-2317.

Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.

Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.

Streubel, et al. "High Brightness AlGaInP Light-Emitting Diodes", IEEE Journal on Selected Topics In Quantum Electronics, vol. 8, No. 2, Mar./Apr. 2002, pp. 321-332.

George Craford, Philips Lumileds Lighting Company, "Light Extraction From LEDs", Session J3: Emerging Science of Solid State Lighting—Current State of the Art in High Brightness LEDs, p. 7, American Physical Society March Meeting, vol. 52, No. 1, Mar. 6, 2007.

LEDs Magazine—Lumileds Introduces Thin Film Flip Chips to Boost LED Brightness, Jul. 11, 2007, available at http://ledsmagazine.com/news/4/7/16.

Office Action from U.S. Appl. No. 12/821,069, Dec. 28, 2010.

Office Action from U.S. Appl. No. 12/002,429, Jan. 28, 2011.

Wu et al., "Bias-Dependent Performance of High-Power AlGaN/GaN HEMTS," IEDM-2001, Washington DC, Dec. 2-6, 2001, pp. 378-380.

Wu Lu, "AlGaN/GaN HEMTS on SiC With Over 100 Ghz FT and Low Microwave Noise," IEEE Transactions on Electron Devices, vol. 48, No. 3, Mar. 2001, pp. 581-585.

Wu et al., "30-W/MM GaN HEMTS by Field Plate Optimization," IEEE Electron Device Letters, vol. 25, No. 3, Mar. 2001, pp. 117-119.

Karmalkar et al., "Very High Voltage AlGaN/GaN High Electron Mobility Transistors Using a Field Plate Deposited on a Stepped Insulator," Solid State Electronics 45 (2001), pp. 1645-1652.

Wu et al., "High Al-Content AlGaN/GaN HEMTS on SiC Substrates With Very-High Power Performance," IEEE 1999 Digest, pp. 925-927.

Gaska et al., "High-Temperature Performance of AlGaN/GaN HFETS on SiC Substrates," IEEE Electron Device Letters, vol. 18, No. 10, Oct. 1997, pp. 492-494.

Gaska et al., "Electron Transport in AlGaN-GaN Heterostructures Grown on 6H-SiC Substrates," Applied Physics Letters, vol. 72, No. 6, Feb. 1998, pp. 707-709.

Gelmont et al., "Monte Carlo Simulation of Electron Transport in Gallium Nitride," J. Applied Physics, vol. 74, No. 3, Aug. 1993, pp. 1818-1821.

Xing et al., "High Breakdown Voltage AlGaN-GaN HEMTS Achieved by Multiple Field Plates," IEEE Electron Device Letters, vol. 25, No. 4, Apr. 2004, pp. 161-163.

IEEE Electron Device Letters, vol. 21, No. 2, Feb. 2000, pp. 63-65, "AlGaN/GaN Metal Oxide Semiconductor Heterostructure Field Effect Transistor," M. Asif Khan et al.

IEEE Electron Device Letters, vol. 21, No. 9, Sep. 2000, pp. 421-423, "High Breakdown GaN HEMT with Overlapping Gate Structure," N.-Q. Zhang et al.

"Enhancement of Base Conductivity Via the Piezoelectric Effect in AlGaN/GaN HBTs," Asbeck et al., Aug. 18, 1999, Solid State Electronics 44 (2000), pp. 211-219.

"New UV Light Emitter based on AlGaN Heterostructures with Graded Electron and Hole Injectors," Johnson et al., XP-002505432, Mat. Res. Soc. Symp. Proc. vol. 743, 2003, pp. L7.4.1-L7.4.6.

"Polarization-Induced 3-Dimensional Electron Slabs in Graded AlGaN Layers," Simon et al., XP-002505433, Mater. Res. Soc. Symp. Proc. vol. 892, 2006, pp. 1-6.

Khan et al., "AlGaN/GaN Metal-Oxide-Semiconductor Heterostructure Field-Effect Transistors on SiC Substrates," Applied Physics Letters vol. 77, No. 9, Aug. 28, 2000, pp. 1339-1341.

Okamoto et al. "A 149W Recessed-Gate AlGaN/GaN FP-FET," Microwave Symposium Digest, vol. 3 Jun. 6, 2004, pp. 1351-1354.

\* cited by examiner

OHMIC CONTACTS TO NITROGEN POLARITY GAN

The application claims the benefit of U.S. provisional patent application Ser. No. 60/899,247 to Ashay Chitnis, filed on Feb. 1, 2007.

BACKGROUND OF THE INVENTION

1. Field of the Invention

This invention relates to light emitting diodes, and in particular to forming ohmic contacts on the nitrogen face polarity surfaces of gallium nitride based light emitting diodes.

2. Description of the Related Art

Light emitting diodes (LED or LEDs) are solid state devices that convert electric energy to light, and generally comprise one or more active layers of semiconductor material sandwiched between oppositely doped n-type and p-type layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way emission efficiency can be measured is by the emission intensity in relation to the input power, or lumens per watt. Each of the oppositely doped layers in a typical LED have a contact layers that is used for applying a bias to the LEDs, and for both it is desirable to provide a low resistivity ohmic contact to reduce ohmic losses during operation of the LED. By reducing or minimizing ohmic losses at the contacts, the efficiency (or lumens per watt) can be improved.

LEDs can be formed of many different semiconductor materials, with recent interest and developments focusing on Group III-nitride based devices, such as gallium nitride (GaN) based LEDs. Devices from this material system can be fabricated using different processes such as metal organic chemical vapor deposition (MOCVD). GaN nitride devices are typically formed on growth substrate, and when using MOCVD alternating gallium (Ga) and nitrogen (N) face polarities form the GaN material on the substrate. The GaN epitaxial layer, including the n-type and p-type layers, typically terminate with Ga-face, so that the top surface of both these layers has a Ga-face polarity.

Ohmic contacts to Ga-face polarity GaN layers have been developed and most commonly comprise Ti and Al based contacts [S. Ruminov et al., *Appl. Phys. Lett.* 69, 1556 (1996); B. P. Luther et al., *Appl. Phys. Lett.* 71, 3859 (1997); B. P. Luther et al., *J. Electron Mater.* 27, 196 (1997)]. Formation of contacts to N- and Ga-face n-GaN using a common Ti/Al metal scheme followed by thermal treatment has also been explored [Joon Seop Kwak et al. *Apply. Phys. Lett.* 79, 3254 (2001)]. Considerable disparity in electrical behavior was observed between metal contacts to N and Ga-face n-type GaN. While contacts to Ga-face were ohmic when annealed at 500° C. or higher, no improvement was observed for the N-face n-GaN. This anomaly was attributed to polarization effects in III-Nitrides.

Other studies have also reported the disparity between contacts to N-face and Ga-face GaN [Ho Won Jang et al., *Appl. Phys. Lett.* 80, 3955 (2002); O. Ambacher et al., *Appl. Phys. Lett.* 85, 3222 (1999)]. Both reports conclude that thermal treatment improves contacts to Ga-face GaN while no effect or improvement was seen on N-face n-GaN. Above 600 C, low resistivity contact was achieved for Ga-face, while N-face n-GaN samples exhibited non-linear or Schottky characteristics at same annealing conditions.

As discussed in Ambacher et al., low resistivity ohmic contact to Ga-face n-GaN is achieved at high temperature due to formation of near-interface AlN and thereby creating degenerate GaN below the AlN. Also polarization-induced 2DEG is formed at AlN and GaN interface causing increase in downward band bending as shown in FIG. 1 (from Ambacher et al.). This reduces the Schottky barrier height to allow for electron tunneling, leading to low contact resistivity on Ga-face samples. By comparison, the N-face typically experiences spontaneous polarization in opposite direction as that of Ga-face, such that an AlN on GaN would support formation of 2DHG with opposite band bending, thereby increasing the Schottky barrier height and discouraging electron tunneling.

SUMMARY OF THE INVENTION

The present invention discloses new contacting materials and methods for forming ohmic contact to the N-face surface GaN based semiconductor materials, and devices fabricated using the methods. One embodiment of a light emitting diode (LED) according to the present invention comprising a Group-III nitride active epitaxial region between two Group-III nitride oppositely doped epitaxial layers. The oppositely doped layers have alternating face polarities from the Group III and nitrogen (N) materials and at least one of the oppositely doped layers has an exposed surface with an N-face polarity. A first contact layer is included on and forms an ohmic contact with the exposed N-face polarity surface.

Another embodiment of an LED according to the present invention comprises a gallium nitride (GaN) based active region between a GaN based p-type layer and a GaN based n-type layer. The n-type layer has an exposed surface with an N-face polarity. A first contact layer is provided on and forming an ohmic contact with the exposed N-face polarity surface.

One embodiment of a method for fabricating an LED according to the present invention comprises forming an epitaxial active region between first and second oppositely doped epitaxial layers, all on a growth substrate. The first oppositely doped layer is adjacent the growth substrate, wherein the epitaxial layers are formed on the growth substrate with alternating face polarities. The growth substrate is removed exposing a surface of the first oppositely doped layer and a first contact layer is formed on the exposed surface of the first oppositely doped layer. The first contact layer cooperates with the polarization effects of the face polarity of the exposed surface to form an ohmic contact.

Another method for fabricating an LED according to the present invention comprises forming a first doped semiconductor layer made of a material having alternating face polarities surfaces, with one of the face polarities being nitrogen (N)-face polarity. A first contact layer is integral to the first doped layer, with the first contact layer cooperating with one of the N-face polarity surfaces to provide an ohmic contact to the first doped layer. An active semiconductor region is formed on the first doped layer, and a second doped semiconductor layer is formed on the active region.

These and other aspects and advantages of the invention will become apparent from the following detailed description and the accompanying drawings which illustrate by way of example the features of the invention.

DETAILED DESCRIPTION OF THE INVENTION

Figure 1:
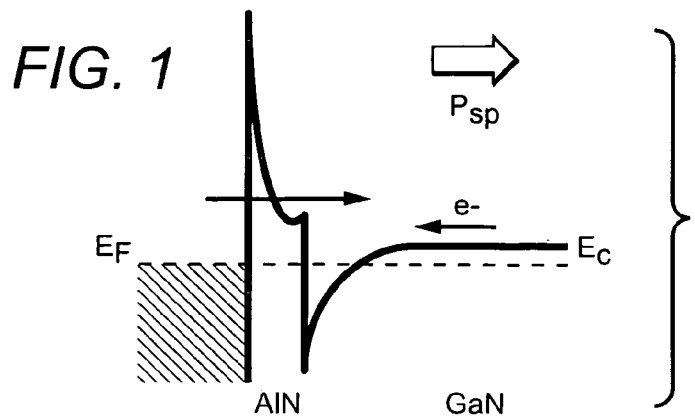
FIG. 1, is a band diagram an AlN layer on Ga-face surface of GaN epitaxial layer.

The present invention is directed to contacting the N-face surface of Group-III nitride epitaxial layers using a material taking advantage of the polarization effects in Group-III nitrides to form ohmic contacts on the N-face. In one embodiment the epitaxial layers comprise the GaN material systems and InN is used as an ohmic contact on the N-face surface of GaN. In other embodiments an embedded InN layer can be included in the epitaxial layers, with conventional contact materials then used for forming the ohmic contact to the N-face.

The present invention is described herein with reference to certain embodiments but it is understood that the invention can be embodied in many different forms and should not be construed as limited to the embodiments set forth herein. In particular, the present invention is described below in regards to Group-III nitride LEDs, but can also be applied to contacting other devices, including but not limited to solid state lasers.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. For purposes of illustration and understanding, some of the features of the embodiments below may be shown out of scale in the following figures.

Figure 2A:
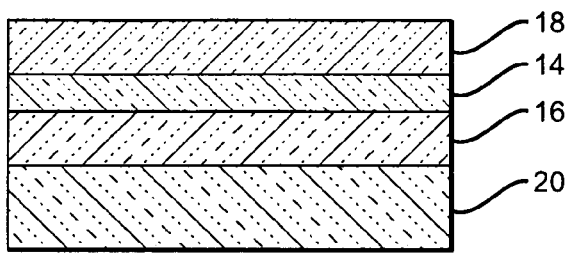
FIG. 2a is a sectional view of one embodiment of as LED at a fabrication step in one method according to the present invention.

FIGS. 2a though 2c show one embodiment of an LED 10 according to the present invention, and although the present invention is described with reference to fabrication of a single LED it is understood that the present invention can also be applied to wafer level LED fabrication or fabrication of groups of LEDs. The wafer or groups of LEDs can then be separated into individual LEDs using known singulation or dicing methods.

The LED 10 can have many different semiconductor layers arranged in different ways. The fabrication and operation of LEDs is generally known in the art and only briefly discussed herein. The layers of the LED 10 can be fabricated using known processes with a suitable process being fabrication using MOCVD. The layers of the LED 10 generally comprise an active layer/region 14 sandwiched between n-type and p-type oppositely doped epitaxial layers 16, 18, all of which are formed successively on a growth substrate 20. It is understood that additional layers and elements can also be included in the LED 10, including but not limited to buffer, nucleation, contact and current spreading layers as well as light extraction layers and elements. The active region 14 can comprise single quantum well (SQW), multiple quantum well (MQW), double heterostructure or super lattice structures.

The region 14 and layers 16, 18 of the LEDs 12 can be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers 16, 18 are gallium nitride (GaN) and the active region 14 comprises InGaN. In alternative embodiments the n- and p-type layers 16, 18 may be AlGaN, aluminum gallium arsenide (AlGaAs) or aluminum gallium indium arsenide phosphide (AlGaInAsP).

The growth substrate 20 can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III-nitrides than sapphire and results in Group III-nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Patents, No. Re. 34,861; U.S. Pat. Nos. 4,946,547; and 5,200,022.

Figure 2B:
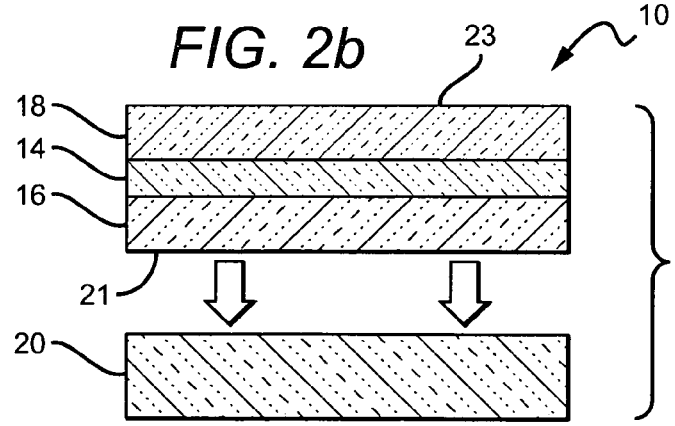
FIG. 2b is a sectional view of the LED in FIG. 2a following removal of the growth substrate.

Referring now to FIG. 2b, the present invention is particularly adapted for use with LEDs where the growth substrate 20 is removed and a contact is formed on the surface of the n-type layer 16 surface exposed by removal of the substrate 20. Many different substrate removal processes can be used including known grinding and/or etching processes. As discussed above, alternating N-face and Ga-face polarities are formed on the growth substrate, with the first polarity on the substrate typically being the N-face. After removal of the growth substrate the N-face 21 is exposed for contacting and the Ga-face is the top surface.

In some embodiments the LED 10 can be mounted to a carrier substrate (not shown) that provides mechanical support to the LED 10 during subsequent processing. The carrier substrate can be permanent or temporary so that is can be removed later in the LED fabrication process.

Figure 2C:
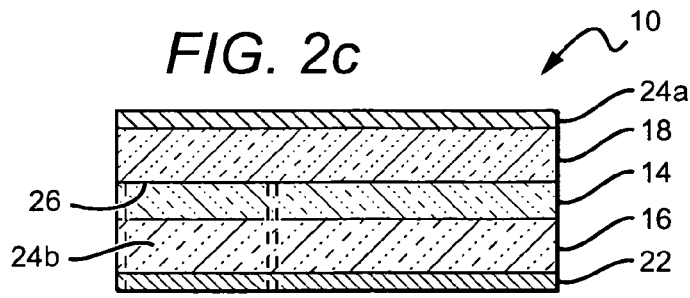
FIG. 2c is a sectional view of the LED in FIG. 2b following formation of n-type and p-type contacts.

Referring now to FIG. 2c, the LED 10 is shown with an n-type contact 22 formed on the now-exposed surface the n-type layer 16. Depending on the structure of the LED 10, the layer 16 can be formed over a portion of or the entire surface of the n-type layer. Materials for the n-type contact 22 according to the present invention take advantage of the polarization effects of Group III-nitride material to form an ohmic contact. In one embodiment, indium nitride (InN) can be used which forms an ohmic contact to N-face, although it is understood that other materials can also be used. In embodiments where the deposition temperature should be kept relatively low, and low temperature vacuum evaporation processes such as sputtering, reactive sputtering, ebeam, etc. can be used to deposit desired thickness of InN films. In embodiments where higher deposition temperatures can be tolerated, higher temperature deposition processes can be used such as MOCVD. In-situ annealing, or post deposition annealing in vacuum or gas, can be done to obtain desired layer properties, such as the correct layer phase. The contact 22 can have many different thicknesses, from a couple Angstroms to many hundreds of Angstroms or more, with a suitable range of thicknesses being 2-50 Angstroms.

Figure 3:
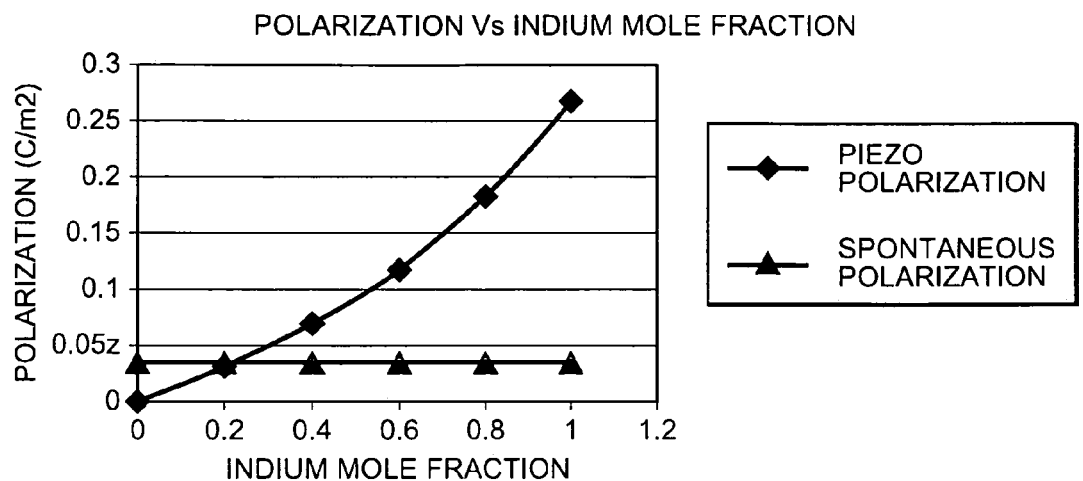
FIG. 3 is a graph showing the polarization verses in the indium mole fraction for an n-type contact according to the present invention.
Figure 4:
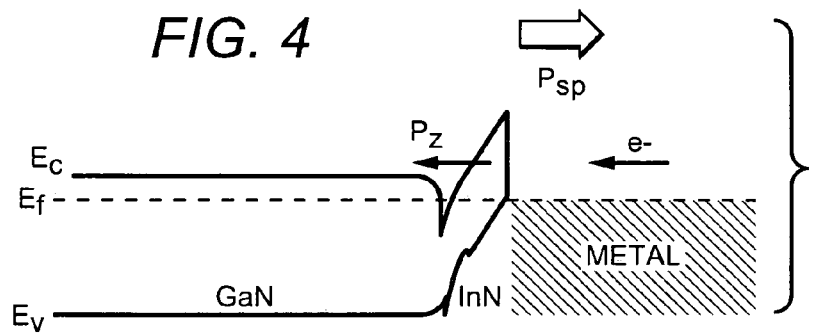
FIG. 4 is a band diagram an InN layer according to the present invention formed on an N-face surface of a GaN epitaxial layer.

Based on the polarization effects in Group III-nitrides, a GaN heterostructure or layer with N-face polarity having an InN contact behaves similarly to a Ga-face heterostructure or layer having a conventional Ti and/or Al based contact. InN or $In_xGa_{1-x}N$ (where $0<x<1$ is the molar fraction) under compressive strain on N-face GaN typically has the piezoelectric and spontaneous polarizations in the opposite directions compared to Ga-face GaN. This leads to formation of either hole or electron gas at the interface depending whether the spontaneous or piezoelectric polarization dominates. FIG. 3 shows the plot 30 of polarization versus indium molar fraction x for $In_xGa_{1-x}N$. For $x>0.2$, the piezo-polarization dominates, which leads to formation of 2DEG at the n-contact GaN interface. FIG. 4 shows an energy band diagram 40 for InN n-contact and GaN heterostructure with N-face (or polarity), with a metal layer over the InN n-contact. Spontaneous polarization ($P_{sp}$) is directed towards the surface while the piezoelectric polarization in InN is in opposite direction with the film under compressive strain. This can allow for tunneling of electrons, leading to low contact resistivity such as less than $1E-5$ ohm $cm^2$. It is understood, however, that in other embodiments the contact resistivity can be better than or other than $1E-5$ ohm $cm^2$.

InN contacts to N-face GaN allow for formation of low resistivity ohmic contacts to n-face GaN at low temperatures, while still allowing for low cost fabrication processes. The formation is compatible with standard process/fabrication technologies. This material can also provide transparent conducting indium oxy-nitride films (InON) films by controlling deposition chemistry. Such films can improve light extraction efficiency and also minimize current crowding.

The LED 10 can also comprise a p-contact 24a on the top surface of the p-type layer 18 for conventional vertical geometry devices. The p-type contact 24a comprising conventional metals such as Ti, Al, Pd, Pt, Au etc. For lateral devices portions of the n-contact 22, n-type layer 16 and the active region 14 can be removed, such as by etching, to form a mesa 26 on the p-type layer. A p-contact 24b (shown in phantom) can be formed on the mesa 26 so that both the p-contact 24b and n-contact 24 are accessible from one side of the LED 10.

The N-face contacts according to the present invention can be used in different ways with different devices structures. In some embodiments, the InN (or $In_xGa_{1-x}N$) contact can be part of the growth structure as an embedded contact layer. For these embodiments the InN ($In_xGa_{1-x}N$) layer can be deposited during device growth. Upon substrate removal conventional metals such as Ti, Al, Pd, Pt, Au etc. can possibly be used to obtain low resistivity ohmic contacts. The fact that $In_xGa_{1-x}N$ requires low temperature growth would need to be taken into consideration when incorporating the contact layer in the device structure. Selective or self-limiting etching between InN ($In_xGa_{1-x}N$) and GaN may be desired for contact formation and conventional etch chemistries cannot be used for these materials. This approach may also require removal/etching of undesired In ($In_xGa_{1-x}N$) layer to avoid absorption losses in the LED.

In embodiments where the InN ($In_xGa_{1-x}N$) is provided as an external contact layer, it can be deposited by conventional vacuum deposition technologies such as ebeam, sputtering, reactive sputtering, etc. followed by low temperature annealing if required. These are typically low temperature processes, which can be necessary in certain device geometries. This process is also cost effective and is compatible with standard with standard fabrication technology. The InN contact layer could have a thickness to exist pseudomorphically on N-face GaN and transparent conducting indium oxy-nitride films can be realized by controlling deposition chemistry. Such films are desired for improving light extraction efficiency and also minimizing current crowding effects. The deposited contact layer, however, should be of high quality, purity and possibly pseudomorphic. Contamination of the InN and N-face interface should be minimized.

It is understood that other LED structures and geometries can be provided for use in the present invention with the structures having contacts accessible from different surfaces. These alternative embodiments can provide access by utilizing conductive structures such as wire bonds, conductive vias, traces or other conductive paths. Other layers or structures can be included to assist in current spreading across the surfaces. Examples of these materials include platinum (Pt) or transparent conductive oxides such as indium tin oxide (ITO), although other materials can also be used. Current spreading structures (not shown) can also be included on the surfaces of the p-type or n-type mesa to improve current spreading and injection from their contacts. The current spreading structures can have many different forms, but preferably comprises fingers of conductive material on the surface of the LED contacting the one of the contacts. The current spreading structures can be deposited using known methods and can comprise the materials described above such as Au, Cu, Ni, In, Al, Ag or combinations thereof and conducting oxides and transparent conducting oxides.

Reflective layers (not shown) can be included between the LEDs 10 and can comprise a highly reflective metal or reflective semiconductor structures such as a DBR. The reflective layer reflects LED light that is emitted in an undesirable direction and helps prevent light from passing into structures where at least some of the light can be absorbed. The reflected light also encourages light emission toward the top of the LED 10.

The LED 10 described above can also be mounted in different LED packages according to the present invention. The packages generally comprises a second submount or PCB, with the LED 10 mounted on the PCB. In some embodiments a reflector cup assembly ("reflector cup") can also be mounted on the PCB. Secondary optics, such as a lens can be placed over the LED 10 and in one embodiment shown the lens can be mounted directly on LED 10, or an encapsulating material can included around the LED. Many different lenses and encapsulating materials can be used in the packages according to the present invention to provide different output characteristics.

It is understood that in other embodiments, the LED's growth substrate can be only partially removed, leaving a portion of N-face material uncovered for contacting. The growth substrate or the remaining portions can be shaped or textured to enhance light extraction from the LEDs.

Although the present invention has been described in detail with reference to certain preferred configurations thereof, other versions are possible. Therefore, the spirit and scope of the invention should not be limited to the versions described above.

I claim:

1. A method for fabricating a light emitting diode (LED), comprising:
   forming an epitaxial active region between first and second oppositely doped epitaxial layers on a growth substrate with said first oppositely doped layer adjacent said growth substrate, wherein said epitaxial layers are formed on said growth substrate with alternating face polarities;
   removing said growth substrate exposing a surface of said first oppositely doped layer, wherein said exposed surface comprises an N-face polarity; and
   forming a first contact layer on said exposed surface of said first oppositely doped layer, said first contact layer cooperating with the polarization effects of said face polarity of said exposed surface to form an ohmic contact.

2. The method of claim 1, wherein said epitaxial active region and said oppositely doped layers are formed from a Group-III nitride material system.

3. The method of claim 1, wherein said epitaxial active region and said oppositely doped epitaxial layers are formed from a gallium nitride (GaN) material system.

4. A method for fabricating a light emitting diode (LED), comprising:
   forming an epitaxial active region between first and second oppositely doped epitaxial layers on a growth substrate with said first oppositely doped layer adjacent said growth substrate, wherein said epitaxial layers are formed on said growth substrate with alternating face polarities;
   removing said growth substrate exposing a surface of said first oppositely doped layer; and
   forming a first contact layer on said exposed surface of said first oppositely doped layer, said first contact layer cooperating with the polarization effects of said face polarity of said exposed surface to form an ohmic contact;
   wherein said epitaxial layers are formed of alternating N-face and Ga-face polarities, said exposed surface having an N-face polarity.

5. A method for fabricating a light emitting diode (LED), comprising:
   forming an epitaxial active region between first and second oppositely doped epitaxial layers on a growth substrate with said first oppositely doped layer adjacent said growth substrate, wherein said epitaxial layers are formed on said growth substrate with alternating face polarities;
   removing said growth substrate exposing a surface of said first oppositely doped layer; and
   forming a first contact layer on said exposed surface of said first oppositely doped layer, said first contact layer cooperating with the polarization effects of said face polarity of said exposed surface to form an ohmic contact;
   wherein said epitaxial layers are formed from a GaN material system and wherein said first contact layer comprises indium nitride (InN).

6. The method of claim 1, further comprising forming a second contact layer in contact with said second oppositely doped layer.

7. The method of claim 1, wherein said first contact layer reduces the barrier height at the interface between said first contact layer and said first oppositely doped layer to allow electron tunneling though through the interface.

8. The method of claim 7, wherein said electron tunneling provides low contact resistivity ohmic contact.

9. A light emitting diode (LED), comprising:
   a Group-III nitride active epitaxial region between two Group-III nitride oppositely doped epitaxial layers, said oppositely doped layers having alternating face polarities from the Group III and nitrogen (N) materials, at least one of said oppositely doped layers having an exposed surface with an N-face polarity;
   a first contact layer on and forming an ohmic contact with said exposed N-face polarity surface.

10. The LED of claim 9, wherein said first contact layer cooperates with the polarization of said N-face polarity surface to form said ohmic contact.

11. The LED of claim 9, wherein said first contact layer reduces the barrier height at the interface between said first contact layer and said N-face polarity surface to promote electron tunneling though through the interface.

12. The LED of claim 11, wherein said electron tunneling provides a low resistivity between said first contact layer and said N-face polarity surface.

13. The LED of claim 9, wherein said epitaxial layers are formed of gallium nitride (GaN).

14. The LED of claim 9, wherein said first contact layer is formed of indium nitride (InN).

15. The LED of claim 9, further comprising a second contact layer in contact with one of said oppositely doped layers.

16. A light emitting diode (LED), comprising:
   a gallium nitride (GaN) based active region between a GaN based p-type layer and a GaN based n-type layer, said n-type layer having an exposed surface with an N-face polarity;
   a first contact layer on and forming an ohmic contact with said exposed N-face polarity surface.

17. The LED of claim 16, wherein said n-type layer has alternating Ga-face and N-face polarity surfaces.

18. The LED of claim 16, wherein said first contact layer comprises indium nitride (InN).

19. The LED of claim 16, wherein said first contact layer cooperates with the polarization of said N-face polarity surface to form said ohmic contact.

20. The LED of claim 9, wherein said first contact layer reduces the barrier height at the interface between said first contact layer and said N-face polarity surface to promote electron tunneling though through the interface.

21. The LED of claim 11, wherein said electron tunneling provides a low resistivity between said first contact layer and said N-face polarity surface.

22. A method for fabricating a light emitting diode (LED), comprising:
   forming an a first doped semiconductor layer made of a material having alternating face polarities surfaces, with one of said face polarities being an nitrogen (N)-face polarity;
   forming a first contact layer integral to said first doped layer, said first contact layer cooperating with one of said N-face polarity surfaces to provide an ohmic contact to said first doped layer;
   forming an active semiconductor region on said first doped layer; and
   forming a second doped semiconductor layer on said active region.

23. The method of claim 22, wherein said doped semiconductor layers and active region are formed successively on a growth substrate with said first doped semiconductor layer adjacent said growth substrate, further comprising removing said growth substrate from said first doped semiconductor layer.

24. The method of claim 22, wherein said first contact layer is embedded in said first doped semiconductor layer.

25. The method of claim 23, wherein said first contact layer is on the surface of said first doped semiconductor layer exposed following said removal of said growth substrate.

26. The method of claim 22, wherein said active region and said doped semiconductor layers are formed from a gallium nitride (GaN) material system.

27. The method of claim 22, wherein said doped semiconductor layers are formed from a GaN material system and wherein said first contact layer comprises indium nitride (InN).

28. The method of claim 22, wherein said first contact layer reduces the barrier height at the interface between said first contact layer and said first oppositely doped layer to promote electron tunneling though through the interface.

* * * * *